Sept. 24, 1968 L. H. STEIFF ET AL 3,403,369
CONNECTOR
Filed Feb. 18, 1965

INVENTORS: L.H. STEIFF
R.J. WIRTZ
BY Leo Stanger
ATTORNEY 3,403,369
CONNECTOR
Leon H. Steiff, Peabody, and Ralph J. Wirtz, Andover, Mass., assignors to Bell Telephone Laboratories, Incorporated, New York, N.Y., a corporation of New York
Filed Feb. 18, 1965, Ser. No. 433,701
11 Claims. (Cl. 339—17)

This invention relates to electrical connectors for printed circuit boards, and particularly to test jacks that enable an operator to acquire electrical access to otherwise concealed test points in the wiring on a printed circuit board.

Such jacks generally comprise a conductive portion encapsulated within an insulating housing. They are especially useful on plug-in units forming part of a large system, where in each plug-in unit a frame secures a front face plate to an end of a printed circuit board and the face plate conceals test points on the board's printed wiring. For convenient access to the concealed wiring it has been the practice to mount these test jacks on the front face plates.

Frames are generally secured only to printed circuit boards that have been completed. Thus it has been necessary, after securing the frame, to connect the conductive portions of such face-plate-mounted jacks to the circuit board wiring with a supplementary conductor. This is a comparatively costly and laborious step in an otherwise automatic procedure. However, connecting the jacks directly onto the circuit board, along with other components, by clinching and soldering its conductors to the wiring, produces bonds too weak to withstand the rough mechanical forces that a test probe applies to a jack during use.

It is an object of this invention to improve connectors, particularly test jacks, for a printed circuit board.

More specifically, it is an object of the invention to obviate the need for the extra connection between the conductive portion of a connector and the wiring on a printed circuit board, without, however, complicating the connector or weakening its contact with the printed wiring.

According to a feature of this invention, these objects are achieved, in whole or in part, by supporting the conductive contact that connects the printed circuit board wiring in a plastic housing that protrudes through the face plate and by securing the housing to the board with a plurality of pins extending from the housing through holes in the board and peening the pins across the opposite surface of the board so as to effectively rivet the housing to the board. Such connectors are securely affixed to the circuit board while nevertheless furnishing access to an operator at the opening in the face plate.

With normal manufacturing tolerances, the holes in the printed circuit board may not align exactly with the pins. In that case, some difficulty may occur in seating the housing on the board surface, particularly where the board is of the epoxy-glass type. Here, the edges of the misaligned holes scrape plastic curls or chips from the pins and allow these curls or chips to remain between the board and the housing. The difficulty is compounded by the inability of the pins to depart radially from their positions at their intersection with the housing into conformance with the misaligned holes. That is to say, the closer the bottom of the housing surface approaches the board face, the less able are the pins to accommodate themselves to the misaligned holes. Enlarging the holes is an undesirable answer to this problem because large holes would permit lateral shifting of the jacks in response to rough usage and thus weaken the eletcrical connections. Another object of the invention is to overcome these difficulties.

A more particular object is to permit seating of such jacks on such boards despite normal manufacturing tolerances in hole locations and without enlarging the holes from their normal manufacturing tolerances.

These ends are achieved according to a further feature of the invention by recessing the housing in the areas surrounding the pins so that the pins effectively project from behind the housing surface that should meet the face of the board. The resulting recesses are capable not only of providing a relief for scraped curls and chips that result from forcing pins into misaligned circuit board holes, but also permit the pins to depart from their unstressed positions in the planes of the housing surface that must meet the face of the board. Thus, bending of the pins enables fitting a connector shell on a printed circuit board.

These and other features of the invention, both broader and more specific, are set forth in the claims. Other objects and advantages of the invention will become obvious from the following detailed description when read in light of the accompanying drawing, wherein:

Figure 1:
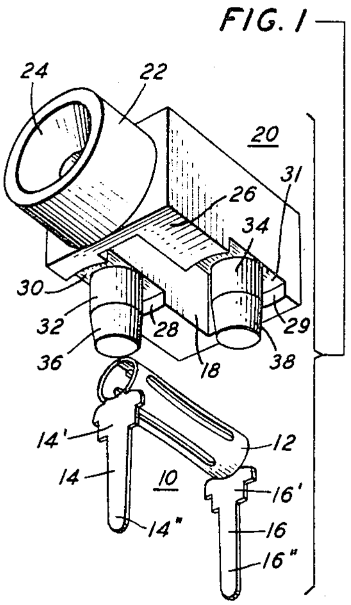
FIG. 1 is an exploded perspective view of a connector according to the invention.
Figure 2:
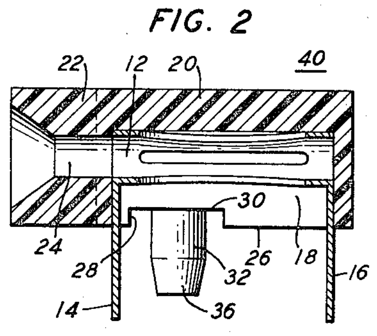
FIG. 2 is a section through the center of the assembled connector in FIG. 1.

In FIGS. 1 and 2 a connector insert 10 includes a longitudinally slotted contact barrel 12 that is narrowed in the center and carries two sword-shaped end terminals 14 and 16. The barrel 12 and the sword handles 14′ and 16′ of the sword-shaped end terminals 14 and 16 are formed from a single sheet of hard-temper beryllium copper. Constituting most of the length of end terminals 14 and 16 are two narrow blade portions 14″ and 16″ made of soft brass. These are securely welded to the handles 14′ and 16′ to form the terminals 14 and 16, and then solder-coated.

The insert 10 is press-fitted longitudinally in an elongated slot 18 of an open-bottom molded nylon insulating housing or shell 20. The housing 20 has a substantially rectangular shape. However, projecting outwardly therefrom and coaxial with the insert 10 is a cylindrical projection 22 having a flared access hole 24 that communicates coaxially with the portion of the slot 18 occupied by the contact barrel 12. The base 26 of the housing 20 includes a pair of recesses 28 and 29 that terminate in flat bottoms 30 and 31. Projecting down from the bottoms 30 and 31 of each recess 28 and 29 are respective parallel pins 32 and 34 integrally molded in the housing 20 and having end tapers 36 and 38.

Figure 3:
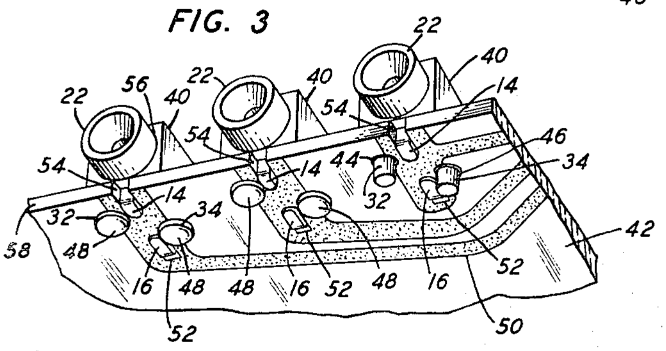
FIG. 3 is a perspective view showing the connectors of FIGS. 1 and 2 mounted on a printed circuit board.
Figure 4:
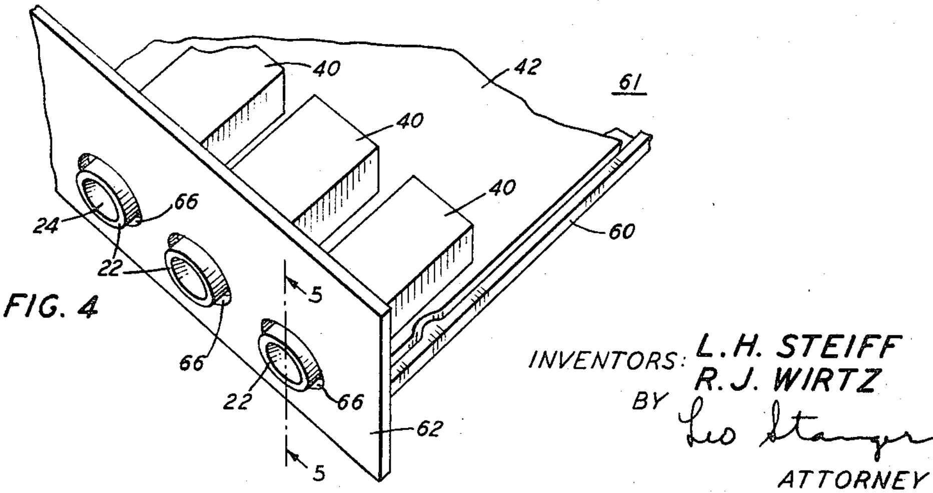
FIG. 4 is a partial perspective view of a plug-in unit employing the connector of FIG. 1.

The housing 20 is comparatively stiff but nevertheless resilient enough to permit some bending of the pins 32 and 34. The housing, together with the insert 10, forms a connector or jack 40. When used, such jacks are assembled onto a printed circuit board 42 as shown in FIG. 3. Here, three connectors are designated 40. Like parts of each jack are similarly designated with like numerals. In FIGS. 3 and 4 the pins 32 and 34 fit through suitable holes 44 and 46 adapted to receive them. The pins are peened over at their ends into mushroom shapes as shown by the mushroom ends designated 48. In FIG. 3, the jack on the right, shown without mushroom ends 48 on the pins, appears in its condition prior to peening.

The terminals 14 and 16 clinch the board and are soldered to wiring 50 on the board. For each jack 40 a hole 52 receives the terminal 16. Each terminal 14 fits around the edge of the board into a step 54 and is clinched to the underside. The depth of each step 54 is such as to align the leading surface 56 of each rectangular housing 20 with the leading edge 58 of the board 42 so that each cylindrical projection 22 extends beyond this edge.

In FIG. 4, a frame 60 surrounding the edges of the board forms a plug-in unit 61. The frame 60 includes a metal face plate 62 having a plurality of openings 66 that receive the cylindrical projections 22 extending over the leading edge of the board 42. Thus, even when the assembled board and frame are placed in an equipment bay the test jacks are accessible through the openings in the face plates without depending upon a mechanical connection thereto. The projection 22 protects test probes that contact the barrels 12 from shorting against the metal face plate 62.

Figure 5:
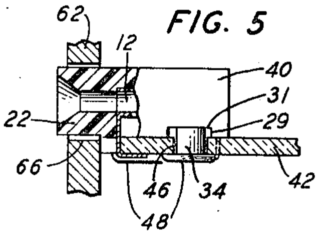
FIG. 5 is a section 5—5 of FIG. 4.

FIG. 5 is a section 5—5 of FIG. 4 and shows one jack 40 secured to the board 42 while projecting through plate 62.

A circuit board 42 such as shown in FIGS. 3, 4, and 5 is coated with wiring in accordance with the usual practice. This may be done, for example, by plating an epoxy-glass board with the wiring design or by copper cladding an epoxy-glass board and etching it so as to leave appropraite wiring. Also in accordance with the usual practice the manufacturing process is continued by tinning the circuit pattern and drilling or punching holes at the proper locations. The holes 44 and 45 adapted to receive the pins 32 and 34 provide only normal clearance. A machine or a workman then mounts components (not shown) forming part of the circuit, such as the resistors and capacitors, onto the board by inserting the appropriate leads through appropriate holes.

Preferably, the jack 40 is included in this mounting operation, and an operator or machine places the jack onto the surface opposite to the one carrying the wiring to which the jack is to connect. Mounting of the jack requires pressing of the pins 32 and 34 into the approprite holes 44 and 46 while slipping the terminals 14 and 16 through the hole 52 and over the step 54.

The leads of the electrical components are clinched upon insertion into the board. Suitable means clinch the terminals 14 and 16 and peen the protruding ends of the pins 32 and 34. This peening operation may be accomplished automatically by spinning or cold flowing. However, heating of the end tapers 36 and 38 is also contemplated.

A subsequent solder dip electrically connects the components and terminals 14 and 16 to the appropriate tinned wiring. The board 42 now is mounted by suitable means in the frame 60 while taking care that the cylindrical projections 22 protrude through the openings 66 in the face plate 62.

After connecting and mounting the thus formed board and mounting the unit in a system bay, the circuit on the board 42 is energized. An operator may now place a test plug through the flared opening 24 until the plug is resiliently held by the narrowed portion of contact barrel 12 on the insert 10. Tests have shown that this jack withstands considerable mechanical insertion and withdrawal of test prongs or plugs, as well as the vigorous lateral and vertical motion that normal testing will apply, without weakening the connnections from the terminals 14 and 16 to the wiring.

The invention provides a simple jack 40, inexpensively produced and assembled, having but two integral members 10 and 20 that are snap-fitted together. Yet, the invention assures a firm grip by the jack 40 on the board 42. Enhancing the tenacity of this grip is the normal clearance between the pins 32, 34, and the openings in the board 42 that need not allow for the possible misalignment expectable in mass manufacturing techniques.

Where such misalignment exists, the tapers 36 and 38 on the pins 32 and 34 enter the misaligned holes with considerable ease. Pressing the remainder of pins 32 and 34 into the respective misaligned holes bends and may scrape the surfaces of the pins.

Seating the rack 40, despite misalignment, is possible because it is the base 26 on the housing 20 which ultimately must rest against the top face of the board 42. However, the pins 32 and 34 bend and articulate from the very bottoms 30 and 31 of the recesses 28 and 29. Thus, within the planes of the bases 26 the pins 32 and 34 can still depart radially from their unstressed axial positions. Furthermore, any chips resulting from scraping remain within the recesses 28 and 29 and will not interfere with seating between the base 26 and the face of the board 42.

No unusual tools are required for seating these jacks. It is only essential that sufficient force be applied to press the jack into place.

While an embodiment of the invention has been described in detail, it will be obvious to those skilled in the art that the invention may be embodied otherwise without departing from its spirit and scope.

What is claimed is:

1. A connector for a printed circuit board comprising an insulating body defining a surface for contact with said board, said body defining a plurality of recesses projecting inwardly from said surface, a pin projecting from each recess beyond the surface for insertion into the board, and conductive means supported by said body for contacting wiring on said printed circuit board, said body defining an elongated opening extending parallel to said surface and transverse to said pins for receiving a test probe, said conductive means including a cylinder-like conductive member extending along said opening for contacting the test probe and a conductive terminal extending from said member in the direction of said pins so as to project through the board at a location spaced from said pins.

2. A connector for a printed circuit board comprising, an insulating body defining a surface for contact with said board, said body being recessed at the surface, a plurality of pins projecting from said body where said body is recessed and extending beyond said surface for insertion into the board, and conductive means supported by said body for contacting wiring on said printed circuit board, said pins projecting beyond the surface a distance greater than the thickness of the board on which it is to be used, said body defining an elongated opening extending parallel to said surface and transverse to said pins for receiving a test probe, said conductive means including a cylinder-like conductive member extending along said opening for contacting the test probe and a conductive terminal extending from said member in the direction of said pins so as to project through the board at a location spaced from said pins.

3. A connector for a printed circuit board comprising, an insulating body defining a surface for contact with said board, said body being recessed at the surface, a plurality of pins projecting from said body where said body is recessed and extending beyond said surface for insertion into the board, conductive means supported by said body for contacting wiring on said printed circuit board, and a rounded portion on said body for projecting through a face plate and defining an opening for access of a contact prong to said conductive means, said body defining an elongated opening extending parallel to said surface and transverse to said pins for receiving a test probe, said conductive means including a cylinder-like conductive member extending along said opening for contacting the test probe and a conductive tab extending from said member in the direction of said pins so as to project through the board at a location spaced from said pins.

4. A connector for a printed circuit board comprising, an insulating body defining a surface for contact with said board, said body defining a plurality of recesses projecting inwardly from said surface, a pin projecting from each recess beyond the surface for insertion into the board, conductive means supported by said body for contacting wiring on said printed circuit board, and a rounded portion on said body for projecting through a panel board and defining an opening for access of a contact to said conductive means, said opening for access of a test probe being transverse to the axes of said pins and being coaxial with said rounded portion, and conductive means including a cylinder-like member extending along said body transverse to said pins and parallel to said surface for contacting the test probe and a conductive tab extending from said member in the direction of said pins so as to project through the board at a location spaced from said pins.

5. A connector for a printed circuit board comprising, a rectangularly shaped plastic body, a cylindrical section projecting from said body, said body and said section defining an opening whose axis is coaxial with said section, said body having a base surface parallel to the axis of said cylindrical section, said body defining in said surface a depression that communicates with said opening, a cylinder-like conductive member in said depression aligned coaxially with said opening and having a contact tab projecting out of said depression, said body defining two recesses in said base surface, and two pins each projecting from said body at the center of said recesses and beyond the base surface, said pins extending a length beyond said base surface greater than the thickness of the board to which said body is to connect.

6. A printed circuit assembly comprising, a board-shaped insulating means, conductive means secured to said insulating means, said insulating means having a leading edge and a first face and an opposite second face, an insulating body mounted on said first face at said edge and having a base surface which contacts said first face, said body being recessed at said surface, a plurality of pins projecting from said body where said body is recessed and projecting through said insulating means, and contact means supported by said body for contacting said conductive means on said insulating means, said insulating body having a longitudinal opening parallel to the surface and transverse to the pins projecting from said body, said contact means including a hollow tube-like member extending along said opening and a conductive tab extending transverse to the opening from said member and through the insulating means, said insulating means forming apertures for receiving said pins and a hole spaced from said pins for receiving said tab, said pins being shaped at points beyond said insulating means to press the surface of the body against said insulating means and hold said body in position.

7. A printed circuit assembly comprising, a board-shaped insulating means, conductive means secured to said insulating means, said insulating means having a leading edge and a first face and an opposite second face, an insulating body mounted on said first face at said edge and having a base surface which contacts said first face, said body being recessed at said surface, a plurality of pins projecting from said body where said body is recessed and projecting through said insulating means, said pins having mushroom-type heads peened against said second face for holding said body, and contact means supported by said body for contacting said conductive means on said insulating means, said insulating body having a longitudinal opening parallel to the surface and transverse to the pins projecting from said body, said contact means including a hollow tube-like member extending along said opening and a conductive tab extending transverse to the opening from said member and through the insulating means, said insulating means forming apertures for receiving said pins and a hole spaced from said pins for receiving said tab, said pins being shaped at points beyond said insulating means to press the surface of the body against said insulating means and hold said body in position.

8. A printed circuit assembly comprising, a board, wiring printed on said board, said board having an edge and two opposite faces, an insulating body having a base surface mounted on one of said faces so that said base surface meets said one of said faces, said body defining a plurality of recesses at said surface, a plurality of pins each projecting from one of said recesses and extending through said board, said pins having mushroom-type heads peened against the other of said faces for holding said body, a panel mounted perpendicular to said board at said edge, a body portion projecting from said body through said panel, said portion and said body defining a hole accessible to a contact outside said panel, and conductive means supported in said hole of said body and connected to said wiring on said board.

9. A printed circuit assembly comprising, a board, wiring printed on said board, said board having an edge and two opposite faces, an insulating body having a base surface mounted on one of said faces so that said base surface meets said one of said faces, said body defining a plurality of recesses at said surface, a plurality of pins one projecting from each of said recesses and extending through said board, said pins having mushroom-type heads peened against the other of said faces for holding said body, a panel mounted perpendicular to said board at said edge, a cylinder portion projecting from said body through said panel, said cylinder portion and said body defining an opening coaxial with said cylinder portion and accessible to a contact outside said panel, and conductive means supported in said hole of said body and connected ot said wiring on said board.

10. A printed circuit assembly comprising, a board, wiring printed on said board, said board having an edge and two opposite faces, a rectangular insulating body having a base surface mounted on one of said faces so that said base surface meets said one of said faces, a panel mounted perpendicular to said board at said edge, a cylinder portion projecting from said body through said panel, said cylinder portion and said body defining an opening coaxial with said cylinder portion and accessible to a contact outside said panel, said body defining in said surface a depression that communicates with said opening, a cylinder-like conductive portion in said depression aligned coaxially with said opening and having a contact tab projecting out of said depression through said board and connected to the wiring in said board, said body defining a plurality of recesses at said surface, and a plurality of pins one projecting from each of said recesses and extending through said board, said pins having mushroom-type heads peened against said second face for holding said body.

11. A printed circuit comprising, a board, wiring printed on said board, a housing seated on said board, a pair of pins integrally projecting from said housing and through said board, said pins having ends peened over and forming mushroom heads that hold said board between said housing and said heads, a cylindrical conductive means encapsulated in said housing, said housing defining an opening to said conductive means, terminal means integral with said conductive member and projecting out of said housing and through said board, said terminal means being solder connected directly to said wiring and being spaced from said pins as they pass through the housing, said housing, said pins, said conductive means, and said terminal means forming a connector having only two integral parts press fitted together.

References Cited

UNITED STATES PATENTS

| | | | |
|---|---|---|---|
| 2,638,573 | 5/1953 | Glickman | 339—64 |
| 2,658,183 | 11/1953 | Klostermann et al. | 339—64 |
| 2,707,272 | 4/1955 | Blitz | 339—17 |
| 2,927,298 | 3/1960 | Griffith | 339—198.3 |
| 2,958,065 | 10/1960 | Flanagan | 339—17 |
| 3,025,489 | 3/1962 | August | 339—64 |
| 3,091,748 | 5/1963 | Takes et al. | 339—64 X |
| 3,208,027 | 9/1965 | Johnson | 339—17 |
| 2,200,059 | 5/1940 | Coyne | 339—17 |
| 2,702,893 | 2/1955 | Paulson | 339—119 |
| 2,863,131 | 12/1958 | Carlzen et al. | 339—193 |
| 2,976,345 | 3/1961 | Whitted | 174—153 |
| 2,979,554 | 4/1961 | Maitland | 174—138 |
| 2,980,880 | 4/1961 | Winkler et al. | 339—128 X |
| 3,148,010 | 9/1964 | Woodward | 339—17 X |

MARVIN A. CHAMPION, *Primary Examiner.*

P. A. CLIFFORD, *Assistant Examiner.*